(12) United States Patent
Shim

(10) Patent No.: US 7,592,196 B2
(45) Date of Patent: Sep. 22, 2009

(54) METHOD FOR FABRICATING A CMOS IMAGE SENSOR

(75) Inventor: Hee Sung Shim, Gangneung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 92 days.

(21) Appl. No.: 12/001,705

(22) Filed: Dec. 11, 2007

(65) Prior Publication Data

US 2008/0160660 A1   Jul. 3, 2008

(30) Foreign Application Priority Data

Dec. 27, 2006   (KR) .................. 10-2006-0134529

(51) Int. Cl.
  *H01L 21/00*   (2006.01)
(52) U.S. Cl. .............. 438/59; 257/462; 257/E27.133; 438/57; 438/144; 438/145
(58) Field of Classification Search .......... 257/E27.133, 257/E27.13, E31.085, 462; 438/57, 59, 144, 438/145
  See application file for complete search history.

(56) References Cited

U.S. PATENT DOCUMENTS

2006/0138471 A1 * 6/2006 Shim ...................... 257/237
2006/0226503 A1 * 10/2006 Cole et al. ................ 257/462
2007/0012966 A1 * 1/2007 Park ......................... 257/291
2007/0052054 A1 * 3/2007 Li ............................ 257/462

* cited by examiner

*Primary Examiner*—Ha Tran T Nguyen
*Assistant Examiner*—Aaron A Dehne
(74) *Attorney, Agent, or Firm*—The Law Office of Andrew D. Fortney; Andrew D. Fortney

(57) ABSTRACT

A method for fabricating a CMOS image sensor may include forming an isolation layer defining an active area on a semiconductor substrate, forming first and second gate electrodes in the transistor area of the semiconductor substrate, forming a photodiode area in the semiconductor substrate at a first side of the first gate electrode, forming an oxide layer over the photodiode area, the oxide layer having a thickness greater than that of the dielectric layer, forming a source/drain extension area in the semiconductor substrate at a second side of the second gate electrode and between the first and second gate electrodes, forming source/drain regions in the transistor area of the semiconductor substrate by ion implantation through the dielectric layer, and forming a complementary ion implantation region in the photodiode area through the oxide layer.

10 Claims, 3 Drawing Sheets

METHOD FOR FABRICATING A CMOS IMAGE SENSOR

The present application claims priority under 35 U.S.C. 119 and 35 U.S.C. 365 to Korean Patent Application No. 10-2006-0134529 (filed on Dec. 27, 2006), which is hereby incorporated by reference in its entirety.

BACKGROUND

An image sensor is a semiconductor device for converting optical images into electric signals, and is mainly classified into a charge coupled device (CCD) and a complementary metal oxide silicon (CMOS) image sensor.

The CCD has a plurality of photodiodes (PDs), which are arranged in the form of a matrix in order to convert optical signals into electric signals. The CCD includes a plurality of vertical charge coupled devices (VCCDs) provided between photodiodes vertically arranged in the matrix so as to transmit electric charges in the vertical direction when the electric charges are generated from each photodiode, a plurality of horizontal charge coupled devices (HCCDs) for transmitting the electric charges that have been transmitted from the VCCDs in the horizontal direction, and a sense amplifier for outputting electric signals by sensing the electric charges being transmitted in the horizontal direction.

However, such a CCD has various disadvantages, such as a complicated drive mode, high power consumption, and so forth. Also, the CDD generally requires multi-step photolithography processes, so the manufacturing process for the CCD may be relatively complicated.

In addition, since it is difficult to integrate a controller, a signal processor, and an analog/digital converter (A/D converter) onto a single chip of the CCD, the CCD may be unsuitable for compact-size products.

Recently, the CMOS image sensor is spotlighted as a next-generation image sensor capable of solving certain problems of the CCD. The CMOS image sensor is a device employing a switching mode to sequentially detect an output of each unit pixel by MOS transistors, in which the MOS transistors are formed on a semiconductor substrate corresponding to the unit pixels through a CMOS technology and which may use peripheral devices, such as a controller and a signal processor. That is, the CMOS sensor includes a PD and MOS transistors in each unit pixel, and sequentially detects the electric signals of each unit pixel through the MOS transistor in a switching mode to realize an image.

Since the CMOS image sensor makes use of CMOS technology, the CMOS image sensor has advantages such as low power consumption and a relatively simple manufacturing process with a relatively smaller number of photolithographic processing steps. In addition, the CMOS image sensor allows the product to have a compact size, because the controller, the signal processor, and the A/D converter can be integrated onto a single chip of the CMOS image sensor. Therefore, the CMOS image sensor has been extensively used in various applications, such as digital still cameras, digital video cameras, and so forth.

Meanwhile, the CMOS image sensors are classified into 3T, 4T and 5T-type CMOS image sensors according to the number of transistors per unit pixel. The 3T-type CMOS image sensor includes one photodiode and three transistors per unit pixel, and the 4T-type CMOS image sensor includes one photodiode and four transistors per unit pixel.

Hereinafter, details will be described regarding the layout for the unit pixel of the 4T-type CMOS image sensor.

FIG. 1 is a layout representing the unit pixel of the related 4T-type CMOS image sensor.

As shown in FIG. 1, an active area is defined in a unit pixel (10) of the CMOS image sensor, and an isolation layer is formed on a semiconductor substrate except for the active area. One photodiode (PD) 16 is formed in a wide portion of the active area, and gate electrodes 13, 14, 20, and 30 of four transistors overlap with remaining portions of the active area.

A transfer transistor incorporates the gate electrode 13, and a reset transistor incorporates the gate electrode 14. A drive transistor incorporates the gate electrode 20, and a select transistor incorporates the gate electrode 30.

The unit pixel 10 includes a floating source/drain impurity area 18 formed on a surface of the semiconductor substrate between the gate electrodes 13 and 14 in the active area of the semiconductor substrate.

SUMMARY

Embodiments of the invention provide a method for manufacturing a CMOS image sensor, capable of minimizing the degradation of characteristics in low illumination environment caused by the increase of a dark signal or a dark defect of a pixel which may result from ion implantation damage occurring in an upper portion of a photodiode.

According to an embodiment, a method for fabricating a CMOS image sensor includes the steps of forming an isolation layer defining an active area on a semiconductor substrate, forming first and second gate electrodes in the active area of the semiconductor substrate, forming a photodiode area in the semiconductor substrate at a first side of the first gate electrode, forming an oxide layer over the photodiode area, the oxide layer having a thickness greater than that of a dielectric layer over the second gate and on the substrate in the transistor area, forming a source/drain extension area in the semiconductor substrate at a second side of the second gate electrode and between the first and second gate electrodes, forming source/drain regions in the transistor area of the semiconductor substrate by ion implantation through the dielectric layer, and forming a complementary ion implantation region in the photodiode area through the oxide layer.

DETAILED DESCRIPTION OF THE EMBODIMENTS

Hereinafter, a method for manufacturing a CMOS image sensor according to embodiments of the present invention will be described in detail with accompanying drawings. FIGS. 2 to 7 are sectional views schematically showing a method for manufacturing a CMOS image sensor according to various embodiments.

Figure 1:
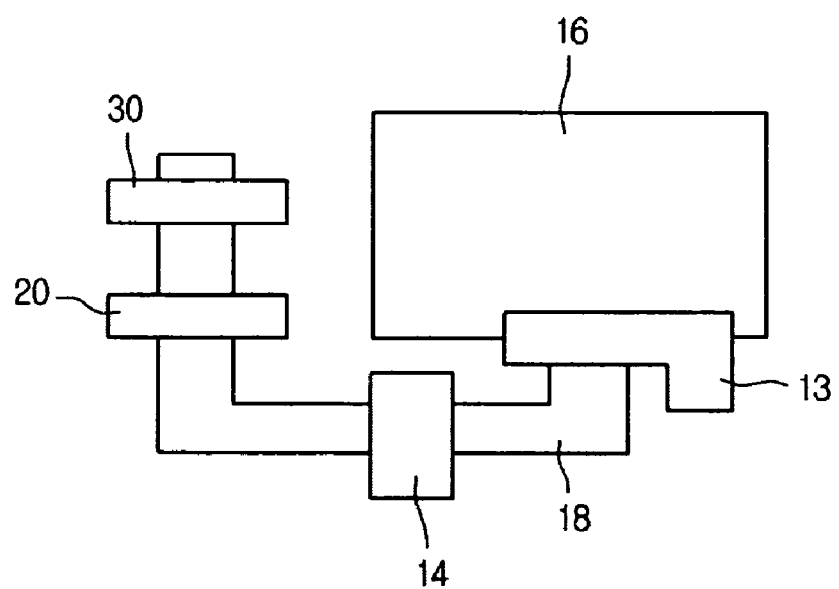
FIG. 1 is a layout view showing a unit pixel of a related 4-type CMOS image sensor.
Figure 2:
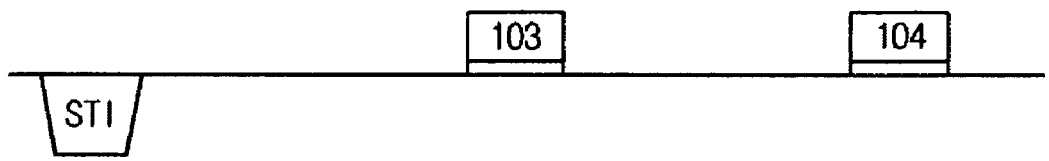
FIGS. 2 to 8 are sectional views showing a method for manufacturing a CMOS image sensor according to embodiments of the present invention.

As shown in FIG. 2, an active area and an isolation area are defined in a semiconductor substrate 101, and an isolation layer 102 is formed in the isolation area through a shallow trench isolation (STI) process. Thereafter, a gate oxide is grown in the active areas, and a conductive layer (e.g., a high concentration multi-crystalline silicon layer) is deposited on the semiconductor substrate 101. Then, portions of the conductive layer and the gate oxide are selectively removed through a photolithography-etching process, thereby forming first and second gate electrodes 103 and 104 having a predetermined distance in the active area of the semiconductor substrate 101.

In this case, the first gate electrode 103 may be a transfer transistor, and the second gate electrode 104 may be a reset transistor.

Figure 3:
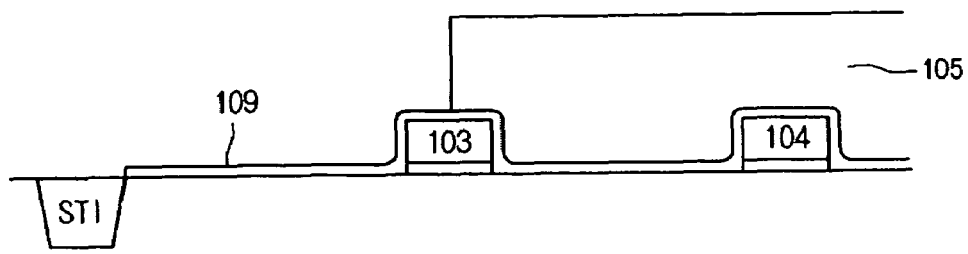

As shown in FIG. 3, a thin dielectric layer 109 (e.g., silicon dioxide) is grown (e.g., by wet or dry thermal oxidation) or deposited (e.g., by chemical vapor deposition [CVD], which may be plasma-enhanced [PE-CVD] or high-density plasma-assisted [HDP-CVD]). The dielectric layer 109 has a first thickness T1, which may be from 10 to 100 Å thick (for example, 20 to 50 Å thick).

Then, a first photoresist is coated on the entire surface of the semiconductor substrate 101 including the first and second gate electrodes 103 and 104, and patterned through an exposure and development process to form a first photoresist pattern 105, thereby defining a photodiode area. Alignment of the edge of the first photoresist pattern 105 is not critical, as long as it is on the gate 103 or a field oxide structure (e.g., STI) surrounding the area to be implanted.

Thereafter, n-type impurity ions are implanted at a low density through dielectric layer 112 into the semiconductor substrate 101 using the first photoresist 105 as an ion implantation mask, thereby forming a photodiode area 106 on the surface of the semiconductor substrate 101. The part of dielectric layer 112 exposed by the first photoresist pattern 105 is then removed by wet or dry etching.

Figure 4:
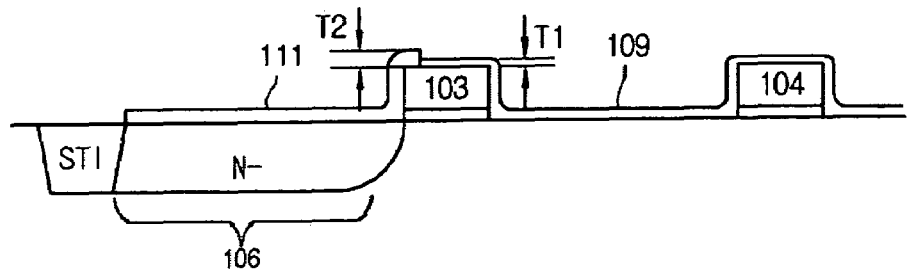

As shown in FIG. 4, a thermal oxide layer 111 is grown (e.g., by wet or dry thermal oxidation) on or in the exposed area(s) of the substrate 101 and gate 103. The thermal oxide layer 111 has a second thickness T2, which is greater than the first thickness T1 of the dielectric layer 112 and which may be from 20 to 150 Å thick (for example, 30 to 100 Å thick). It is believed that the thermal oxide layer 111 can repair damage caused by implantation of the n-type impurity ions that form photodiode area 106, while reducing or eliminating a need for subsequent annealing to repair such ion implantation damage. Then, the first photoresist 105 is removed, resulting in the structure shown in FIG. 4.

Figure 5:
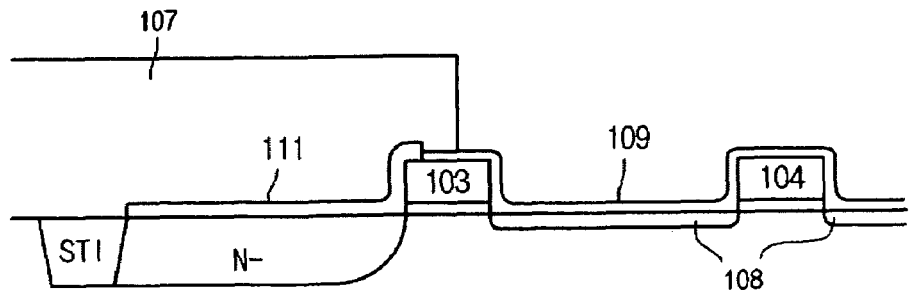

As shown in FIG. 5, a second photoresist is coated on the entire surface of the semiconductor substrate 101 including the first and second gate electrodes 103 and 104. Then, the second photoresist is patterned through an exposure and development process to form a second photoresist pattern 107 such that the photodiode area 106 is covered, and source/drain areas the transistors 103 and 104 are exposed. Alignment of the edge of the second photoresist pattern 107 is not critical. Using the second photoresist 107 as an ion implantation mask, n+ type impurity ions are then implanted into the source/drain area(s), thereby forming source/drain extension areas 108.

The second photoresist 107 is then removed, and a heat-treatment process is performed with respect to the semiconductor substrate 101, thereby diffusing the ion impurity area (s). While the temperature of the heat-treatment may be sufficiently high to repair some or all ion implantation damage in the substrate 101, generally the heat-treatment temperature and time are simply sufficient to diffuse and/or activate the implanted ions.

Ion damage may occur at the surface of the semiconductor substrate 101 corresponding to the photodiode area 106 during the above implantation and/or etching processes. If the photodiode area 106 is oxidized in a thermal oxidation process, the damaged silicon surface can be changed into a silicon oxide (e.g., $SiO_2$) layer so that the damaged portion of the photodiode area 106 can be effectively removed.

Figure 6:
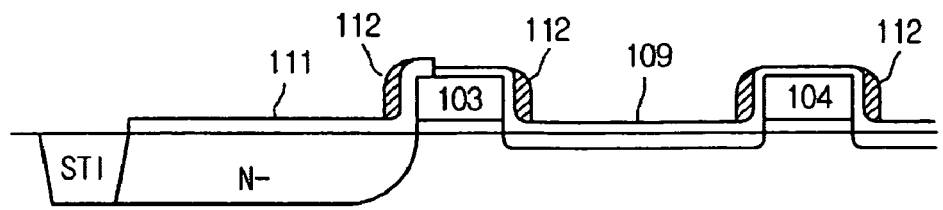

As shown in FIG. 6, an insulating material is conformally deposited (e.g., by CVD) onto the entire substrate, including dielectric layer 109 and thermal oxide layer 111, then the insulating material is anisotropically etched (e.g., etched back) to form spacers 112 on sidewalls of gates 103 and 104. In one embodiment, the insulating material comprises silicon nitride. Optionally, the insulating material comprises a silicon dioxide-on-silicon nitride bilayer.

Figure 7:
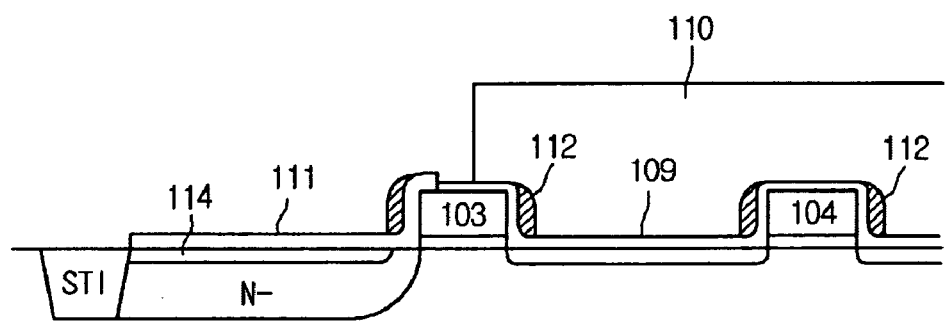

After coating a third photoresist on the semiconductor substrate 101, as shown in FIG. 7, the third photoresist is patterned through an exposure and development process to form a third photoresist pattern 110 on the dielectric layer 109, thereby exposing an upper portion of the photodiode area 106. Alignment of the edge of the third photoresist pattern 110 (particularly with respect to the interface between dielectric layer 109 and thermal oxide 111) is not critical.

Thereafter, using the third photoresist 110, the gate 103 and the spacer 109 on the side of the gate 103 closest to the photodiode 106 as an ion implantation mask, p-type ions are implanted into the photodiode area to form a P0 implant region 114 on the photodiode 106, thereby creating a P-N interface in the photodiode area for converting light to electrical signals. The p-type ion implantation is performed at a relatively low energy and through a relatively thick thermal oxide layer, thereby preventing and/or reducing some ion implantation damage to the surface of the substrate 101 in the photodiode area 106. Some or all of the relatively minor implantation damage can be repaired during dopant diffusion and activation (e.g., heat-treatment, as described above).

Figure 8:
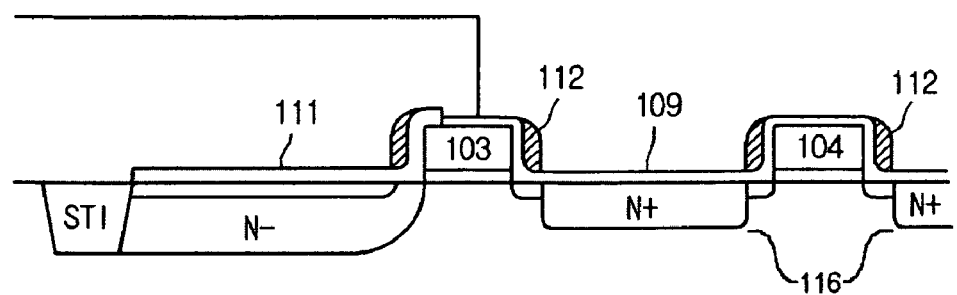

As shown in FIG. 8, the third photoresist pattern 110 is removed, and a fourth photoresist pattern 114 is formed on the thermal oxide layer 111 over the photodiode area 106 and on part of the gate 103, thereby exposing the source/drain areas in the transistor region (including gate 104) of the unit pixel of the CMOS image sensor. Thereafter, using the fourth photoresist pattern 114, the gates (e.g., 103 and 104) and the spacers 109 as an ion implantation mask, a high dose of n-type ions are implanted into the transistor region of the substrate 101 to form N+ implant regions 116, thereby substantially completing the formation of the transistors in the unit pixel for conveying the electrical signals from the photodiode 106.

Although the following processes are not shown in the accompanying drawings, a pre-metal dielectric layer may be formed on or over the unit pixel, metal interconnections may be formed on the pre-metal dielectric layer and in contact holes or vias therein, as well as on or in a plurality of interlayer dielectric layers, and then, a color filter layer and a micro-lens array are formed, thereby substantially completely fabricating the image sensor.

As described above, the present method for fabricating a CMOS image sensor has the following advantages.

A leakage source occurring in the upper portion of a photodiode during its formation can be reduced or eliminated by performing a thermal oxidation process in the photodiode area of the substrate after ion implantation, thereby improving the characteristic of an image sensor without changing the characteristic of a MOSFET.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a CMOS image sensor, comprising:
    forming a photodiode area in an active area of a semiconductor substrate at a first side of a first gate electrode, the semiconductor substrate having the first gate electrode and a second gate electrode thereon defining a transistor area, and a dielectric layer over the semiconductor substrate, the first gate electrode and the second gate electrode;
    forming an oxide layer over the photodiode area, the oxide layer having a thickness greater than that of the dielectric layer;
    forming a source/drain extension area in the semiconductor substrate at a second side of a second gate electrode and between the first and second gate electrodes;
    forming source/drain regions in the transistor area of the semiconductor substrate by ion implantation through the dielectric layer; and
    forming a complementary ion implantation region in the photodiode area through the oxide layer.

2. The method as claimed in claim 1, further comprising removing the dielectric layer from the photodiode area by wet etching.

3. The method as claimed in claim 1, wherein forming the oxide layer comprises thermal oxidation of the semiconductor substrate.

4. The method as claimed in claim 1, further comprising forming the dielectric layer by thermal oxidation of the semiconductor substrate and the first and second gate electrodes.

5. The method as claimed in claim 1, further comprising forming an isolation layer in the semiconductor substrate, defining the active area.

6. The method as claimed in claim 1, further comprising forming the first and second gate electrodes in the transistor area of the semiconductor substrate.

7. The method as claimed in claim 6, wherein the first and second gate electrodes comprise a transfer transistor and a reset transistor.

8. The method as claimed in claim 1, further comprising forming spacers on sidewalls of the first and second gate electrodes.

9. The method as claimed in claim 8, wherein the spacers are formed after forming the source/drain extension area and before forming the source/drain regions.

10. The method as claimed in claim 1, wherein the photodiode area is formed by ion implantation through the dielectric layer.

* * * * *